United States Patent
Jen et al.

(10) Patent No.: US 6,372,560 B1
(45) Date of Patent: Apr. 16, 2002

(54) SIMPLIFIED PROCESS FOR FORMING THIN FILM TRANSISTOR MATRIX FOR LIQUID CRYSTAL DISPLAY

(75) Inventors: Tean_Sen Jen; Jia-Shyong Cheng, both of Tao-Yuan (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/540,593

(22) Filed: Mar. 31, 2000

(30) Foreign Application Priority Data

Apr. 1, 1999 (TW) .......................................... 088105213

(51) Int. Cl.$^7$ .......................... H01L 21/00; H01L 21/84
(52) U.S. Cl. .......................... 438/160; 438/162; 257/59; 257/749; 349/79
(58) Field of Search ................................ 438/160, 158, 438/162; 257/57, 72, 59, 749; 349/79, 87, 156, 153

(56) References Cited

U.S. PATENT DOCUMENTS

| | | | | |
|---|---|---|---|---|
| 5,015,597 A | * | 5/1991 | Vinouze et al. | 438/160 |
| 5,355,002 A | * | 10/1994 | Wu | 257/57 |
| 5,478,766 A | * | 12/1995 | Park et al. | 438/158 |
| 5,693,567 A | * | 12/1997 | Weisfield et al. | 438/162 |
| 5,726,077 A | * | 3/1998 | Kawahata et al. | 438/30 |
| 5,757,453 A | * | 5/1998 | Shin et al. | 349/122 |
| 6,013,930 A | * | 1/2000 | Yamazaki et al. | 257/353 |
| 6,028,325 A | * | 2/2000 | Yamazaki | 257/66 |
| 6,093,580 A | * | 7/2000 | Liu et al. | 438/57 |
| 6,122,025 A | * | 9/2000 | Kim | 349/110 |
| 6,157,426 A | * | 12/2000 | Gu | 349/111 |

FOREIGN PATENT DOCUMENTS

| | | | | |
|---|---|---|---|---|
| JP | 62-299081 | * | 12/1987 | H01L/29/78 |
| JP | 6-235933 | * | 8/1994 | H01L/29/784 |

* cited by examiner

Primary Examiner—Long Pham
Assistant Examiner—William David Coleman
(74) Attorney, Agent, or Firm—Peter F. Corless; Edwards & Angell, LLP

(57) ABSTRACT

A simplified process for forming a thin film transistor matrix for a liquid crystal display is disclosed. By forming and patterning a conductive layer overlying a TFT unit, a data line, a first connection line between the TFT unit and the data line, and a second connection line between the TFT unit and a pixel electrode can be simultaneously formed in the forming and patterning step. Furthermore, after a passivation layer is applied to protect the TFT matrix, an isolation window area, a contact hole and a TAB window can be created in a single patterning step. Therefore, masking steps can be reduced so as to simplify the process. On the other hand, owing to the first connection line for connecting the TFT unit and the scan line is of the same material as the scan line, the resistivity of the connection line is inherently low. Therefore, a TFTLCD of a large area can be made according to this process.

23 Claims, 9 Drawing Sheets

SIMPLIFIED PROCESS FOR FORMING THIN FILM TRANSISTOR MATRIX FOR LIQUID CRYSTAL DISPLAY

FIELD OF THE INVENTION

The present invention relates to a process for forming a thin film transistor (TFT) matrix for a liquid crystal display (LCD), and more particularly to a simplified process for forming the TFT matrix with reduced masking steps.

BACKGROUND OF THE INVENTION

For conventional manufacturing processes of a TFTLCD, six to nine masking steps are required for forming the TFT matrix. One of the processes, which is a 6-mask one, is illustrated as follows.

The conventional process includes steps of:

i) applying a first conductive layer onto a glass substrate 10, and using a first photo-masking and lithography procedure to pattern and etch the first conductive layer to form an active region 12 consisting of a scan line and a gate electrode of a TFT unit, as shown in FIG. 1A;

ii) sequentially forming an insulation layer 14, an amorphous silicon (a-Si) layer 16, an $n^+$ amorphous silicon layer 18 and a photoresist 19 on the resulting structure of FIG. 1A, as shown in FIG. 1B, and exposing the resulting structure from the back side of the substrate, as indicated by arrows, wherein a portion of the photoresist 19 above the region 12 is shielded by the region 12 from exposure so as to exhibit a self-aligned effect;

iii) etching off the exposed photoresist 19, portions of the layers 16 and 18 thereunder, and the remaining photoresist so that each of the remaining layers 16 and 18 has a shape substantially identical to the region 12, and using a second photo-masking and lithography procedure to pattern and etch the layers 16 and 18 again to isolate the TFT unit 11, as shown in FIG. 1C;

iv) using a third photo-masking and lithography procedure to further pattern and etch the layers 16 and 18 to form a tape automated bonding (TAB) contact window for the scan line (not shown);

v) applying an indium tin oxide (ITO) layer on the resulting structure of FIG. 1C, and using a fourth photo-masking and lithography procedure to pattern and etch the ITO layer to form a pixel electrode 20 by a single side of the TFT unit 11, as shown in FIG. 1D;

vi) applying a second conductive layer on the resulting structure of FIG. 1D, using a fifth photo-masking and lithography procedure to pattern and etch the second conductive layer to integrally form a data line 23, a first connection line 22a between the TFT unit 11 and the data line 23, and a second connection line 22b between the TFT unit 11 and the pixel electrode 20, and using the remaining second conductive layer as a shield to etch off a portion of the doped a-Si layer 18 between the connection lines 22a and 22b to separate the source/drain electrodes 111 of the TFT unit 11, as shown in FIG. 1E; and vii) applying a passivation layer 24 on the resulting structure of FIG. 1E, and using a sixth photo-masking and lithography procedure to pattern and etch the passivation layer 24 to expose the TAB contact window for the scan line, create a TAB contact window for the data line (not shown), and create an opening window A for the pixel electrode 20.

As known, the count of photo-masking and lithography steps directly affects not only the production cost but also the manufacturing time. Moreover, for each photo-masking and lithography step, the risks of mis-alignment and contamination may be involved so as to affect the production yield. The complicated 6-mask process mentioned as above thus results in relatively high cost and relatively low yield.

For current techniques, the above steps ix) and vii) can be combined to achieve a 5-mask process owing to the improvement on material. That is, all the TAB contact windows can be formed by a single masking and patterning step.

In order to further reduce the count of photo-masking and lithography steps, many efforts have been made to develop new processes. For example, U.S. Pat. Nos. 5,346,833 and 5,478,766 issued to Wu and Park et al., respectively, disclose 3 and/or 4-mask processes for making a TFTLCD, which are incorporated herein for reference. It is to be noted that the 3-mask process for each of Wu and Park et al. does not include the step of forming and patterning of a passivation layer. If a passivation layer is required to assure of satisfactory reliability, the count of photo-masking and lithography steps should be four.

Although Wu and Park et al. disclose the processes of reduced masks, the use of the ITO layer, which is integrally formed with the ITO pixel electrode, as the connection line between the TFT unit and the data line limits the area of the TFTLCD due to the high resistivity of ITO.

SUMMARY OF THE INVENTION

Therefore, an object of the present invention is to provide a reduced mask process for forming a thin film transistor (TFT) matrix for a liquid crystal display (LCD), in which the connection line between the TFT unit and the data line has a relatively low resistivity compared to the ITO connection line so as to be suitable for a large-area TFTLCD.

Another object of the present invention is to provide a four-mask process for forming a thin film transistor (TFT) matrix for a liquid crystal display (LCD).

According to a first aspect of the present invention, a process for forming a TFT matrix for an LCD includes steps of: providing a substrate made of an insulating material; forming a first conductive layer on a first side of the substrate, and using a first masking and patterning procedure to form a scan line and a gate electrode of a TFT unit; successively forming an insulation layer, a semiconductor layer, a doped semiconductor layer, and a photoresist layer on the substrate with the scan line and the gate electrode; providing an exposing source from a second side of the substrate opposite to the first side by using the scan line and the gate electrode as shields to form an exposed area and an unexposed area; removing the photoresist, the doped semiconductor layer, and the semiconductor layer of the exposed area so that the remained portion of the semiconductor and the doped semiconductor layers in the unexposed area has a specific shape substantially identical to the shape of the scan line together with the gate electrode; forming a second conductive layer on the substrate with the semiconductor and the doped semiconductor layers of the specific shape, and using a second masking and patterning procedure to integrally form a data line, a first connection line between the TFT unit and the data line, and a second connection line connecting to the TFT unit; removing a portion of the doped semiconductor layer with the data line, and the first and the second connection lines as shields; and forming a transparent conductive layer on the substrate with the data line, and the first and the second connection lines, and using a third masking and patterning procedure to form a pixel electrode which is connected to the TFT unit through the second connection line.

When the exposing source is a light radiation, the insulating material is a light-transmitting material such as glass.

Preferably, the first conductive layer is formed of chromium, tungsten molybdenum, tantalum, aluminum or copper.

Preferably, the insulation layer is formed of silicon nitride, silicon oxide, silicon oxynitride, tantalum oxide or aluminum oxide.

Preferably, the semiconductor layer is formed of amorphous silicon, micro-crystalline silicon or polysilicon.

Preferably, the doped semiconductor layer is formed of $n^+$ amorphous silicon, $n^+$ micro-crystalline silicon or $n^+$ polysilicon.

Preferably, the second conductive layer is a Cr/Al or a Mo/Al/Mo composite layer.

Preferably, the transparent conductive layer is formed of indium tin oxide, indium zinc oxide or indium lead oxide, and applied by sputtering. On the other hand, the patterned transparent conductive layer is located by a single side of the TFT unit.

Preferably, the process further includes a step of forming a passivation layer on the substrate to protect the data line, and the first and the second connection lines, and using a fourth masking and patterning procedure to define an isolation window area, and create a contact hole. The formation of the passivation layer is performed after the step of removing the portion of the doped semiconductor layer with the data line, and the first and the second connection lines as shields. Then, a step of removing a portion of the semiconductor layer in the isolation window area with the patterned passivation layer as a shield is performed to form an isolation window for cutting off the connection of the TFT unit with the data line through the semiconductor layer. Moreover, the transparent conductive layer extends into the contact hole to connect to the second connection line.

Preferably, the passivation layer is formed of silicon nitride or silicon oxynitride.

According to a second aspect of the present invention, a process for forming a TFT matrix for an LCD includes steps of: providing a light-emitting substrate; forming a first conductive layer on the substrate at a first side hereof; using a first photo-mask to pattern the first conductive layer as a scan line and a gate electrode of a TFT unit; sequentially forming an insulation layer, a semiconductor layer, and a doped semiconductor layer over the substrate with the scan line and the gate electrode; using the scan line and the gate electrode as shields, and a radiation light from a second side of the substrate opposite to the first side as an exposing source to pattern the semiconductor and the doped semiconductor layers to define source/drain electrodes of the TFT unit; forming a second conductive layer over the substrate with the patterned semiconductor and doped semiconductor layers; using a second photo-mask to pattern the second conductive layer as a data line, a first connection line between the TFT unit and the data line, and a second connection line connecting to the TFT unit; using the data line, and the first and the second connection lines as shields to remove a portion of the doped semiconductor layer to define an isolation window area; forming a passivation layer over the substrate with the patterned second conductive layer; using a third photo-mask to pattern the passivation layer to simultaneously uncover the isolation window area, create a contact hole for exposing a portion of the second connection line, and create a tape automated bonding (TAB) window for exposing a portion of the scan line and the data line; and using the patterned passivation layer as a shield to remove a portion of the semiconductor layer in the isolation window area to form an isolation window; forming a transparent conductive layer on the substrate with the patterned passivation layer; and using a fourth photo-mask to pattern the transparent conductive layer as a pixel electrode which extends into the contact hole to connect with the TFT unit through the second connection line.

Preferably, the insulating material is glass; the first conductive layer is selected from a chromium, a tungsten molybdenum, a tantalum, an aluminum and a copper layers; the second conductive layer is selected from a Cr/Al and a Mo/Al/Mo composite layers; the insulation layer is formed of a material selected from silicon nitride, silicon oxide, silicon oxynitride, tantalum oxide and aluminum oxide; the semiconductor layer is formed of a material selected from amorphous silicon, micro-crystalline silicon and polysilicon; the doped semiconductor layer is formed of a material selected from highly doped amorphous silicon, micro-crystalline silicon and polysilicon; the passivation layer is formed of a material selected from silicon nitride and silicon oxynitride; and the transparent conductive layer is formed of a material selected from indium tin oxide, indium zinc oxide and indium lead oxide.

According to a third aspect of the present invention, a process for forming a TFT matrix for an LCD includes steps of: providing a substrate made of an insulating material; forming a first conductive layer of a first pattern on a first side of the substrate as a scan line and a gate electrode of a TFT unit; forming an insulation layer over the scan line and the gate electrode; forming a semiconductor and a doped semiconductor layers of a second pattern substantially identical to the first pattern on the insulation layer for defining a source and a drain electrodes of the TFT unit; forming a second conductive layer of a third pattern over the semiconductor and the doped semiconductor layers of the second pattern as a data line, a first connection line between the TFT unit and the data line, and a second connection line connecting to the TFT unit; removing a portion of the semiconductor and the doped semiconductor layers to create an isolation window for cutting off the connection of the TFT unit with the data line through the semiconductor and the doped semiconductor layers; removing another portion of the doped semiconductor layer to isolate the source electrode from the drain electrode of the TFT unit; forming a passivation layer of a fourth pattern over the second conductive layer which includes a contact hole to expose a portion of the second connection line; and forming a transparent conductive layer of a fifth pattern over the passivation layer as a pixel electrode, which further extends into the contact hole to connect with the second connection line.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following description of the preferred embodiment of this invention is presented herein for purpose of illustration and description only; it is not intended to be exhaustive or to be limited to the precise form disclosed.

Figure 1A:
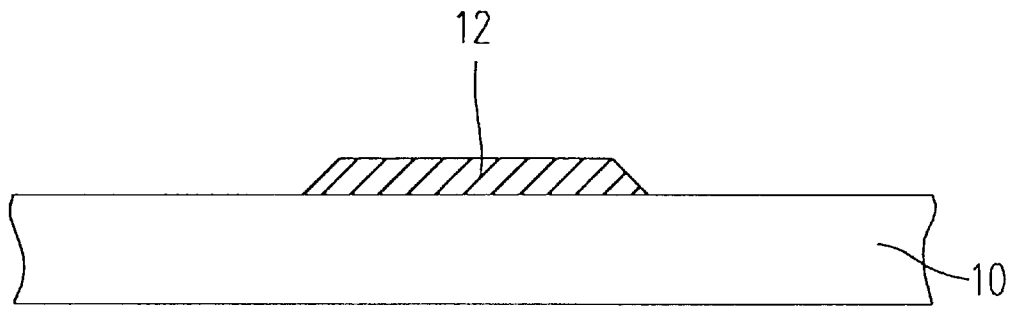
FIGS. 1A~1F are cross-sectional views of intermediate structures of a conventional TFTLCD, which schematically show the formation of the TFT matrix.
Figure 1B:
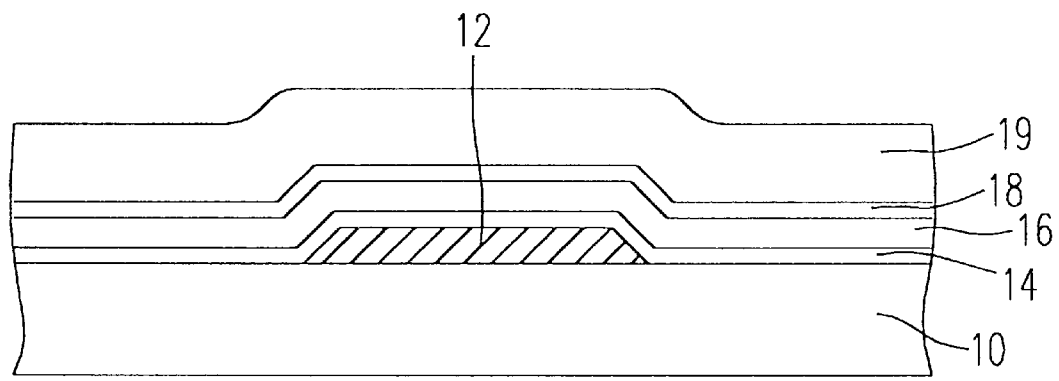
Figure 1C:
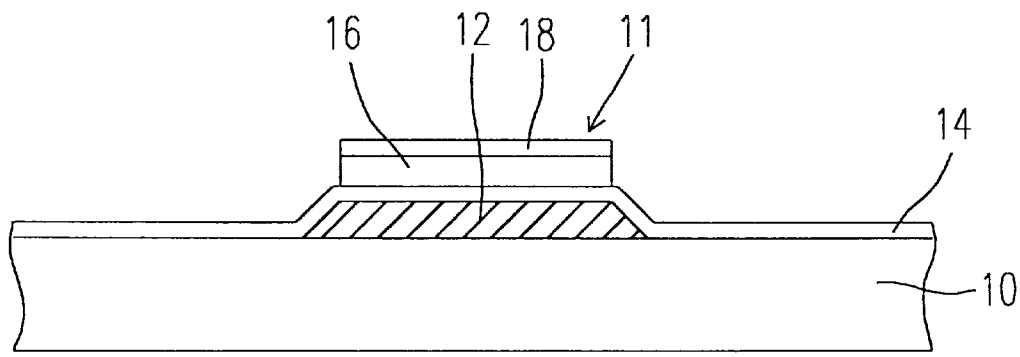
Figure 1D:
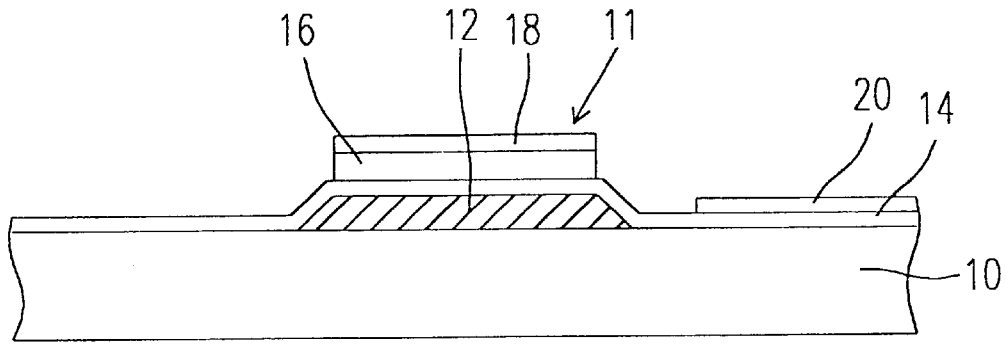
Figure 1E:
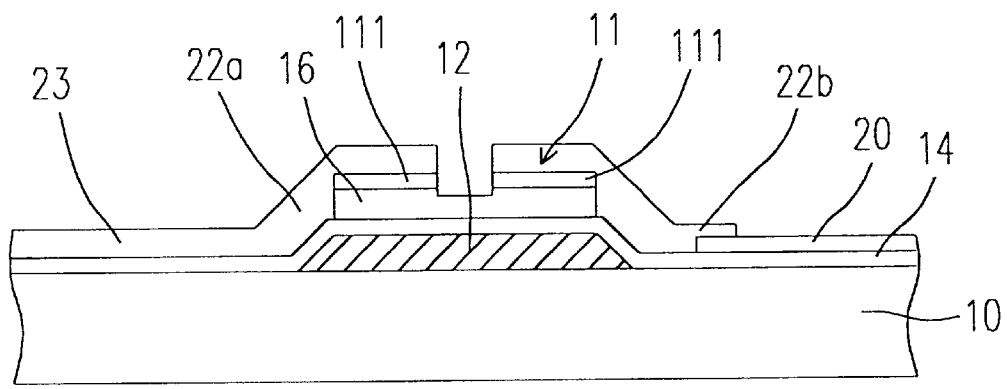
Figure 1F:
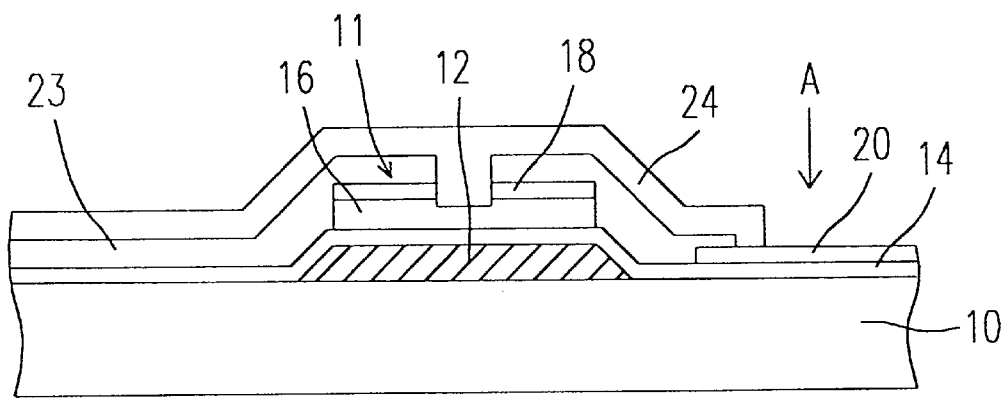
Figure 2A:
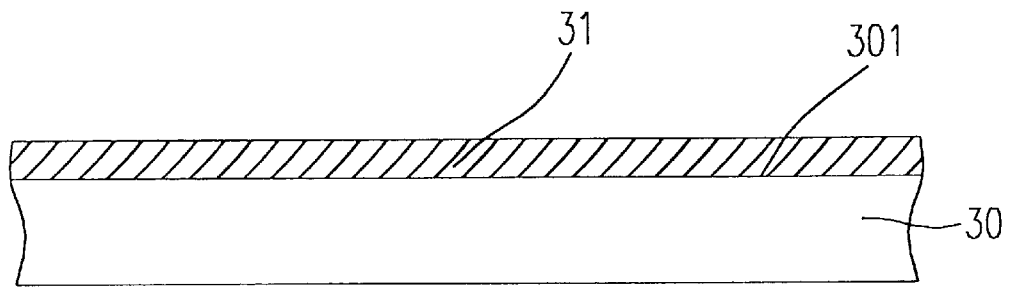
FIGS. 2A through 2J are cross-sectional views of intermediate structures of a TFTLCD according to the present invention, which schematically show a preferred embodiment of a process for forming the TF matrix.
Figure 2B:
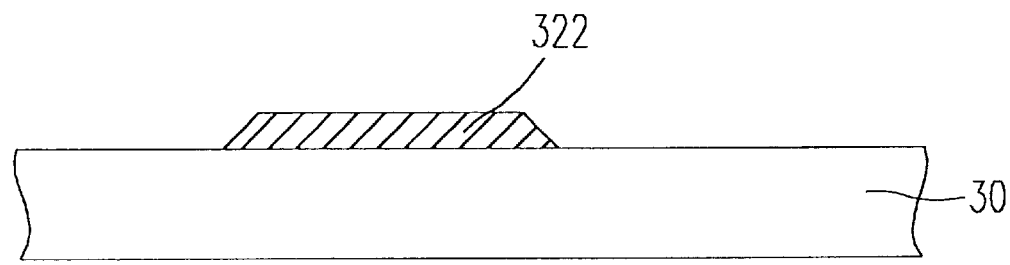
Figure 2C:
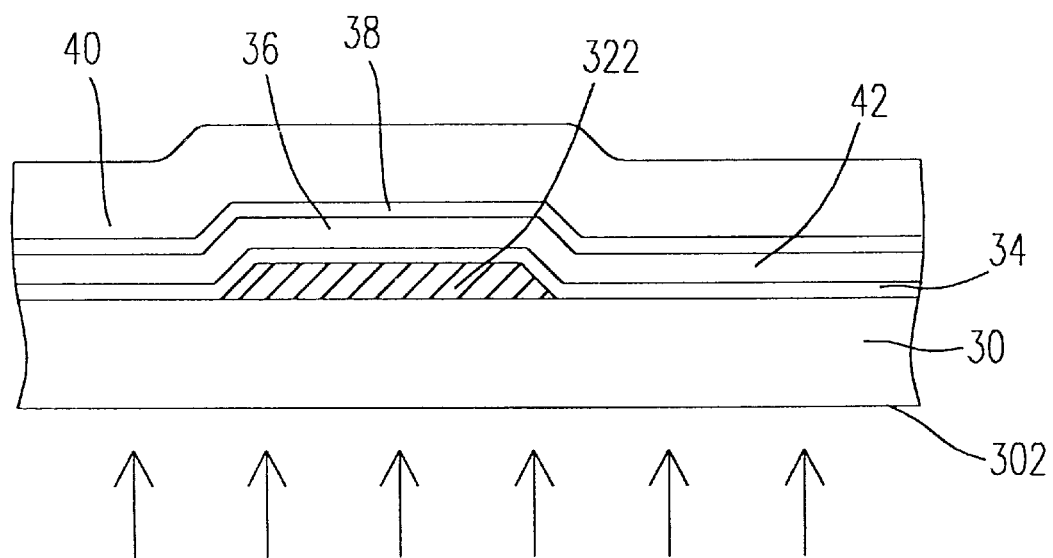
Figure 2D:
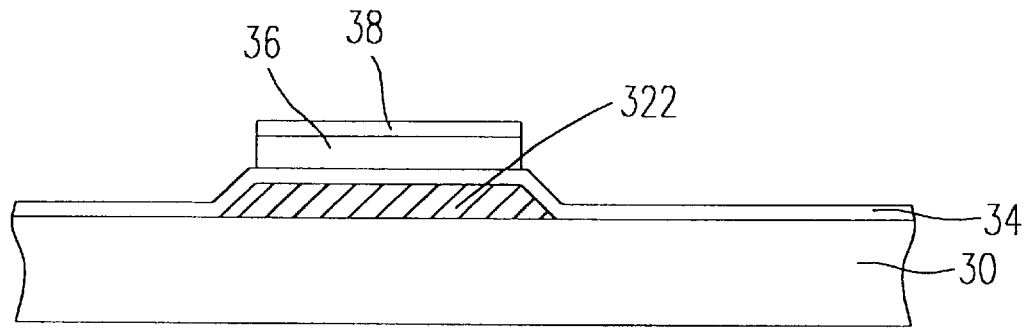
Figure 2E:
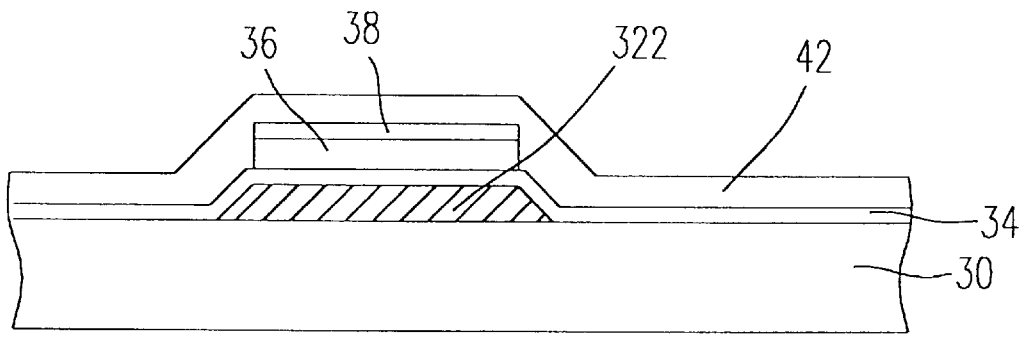
Figure 2F:
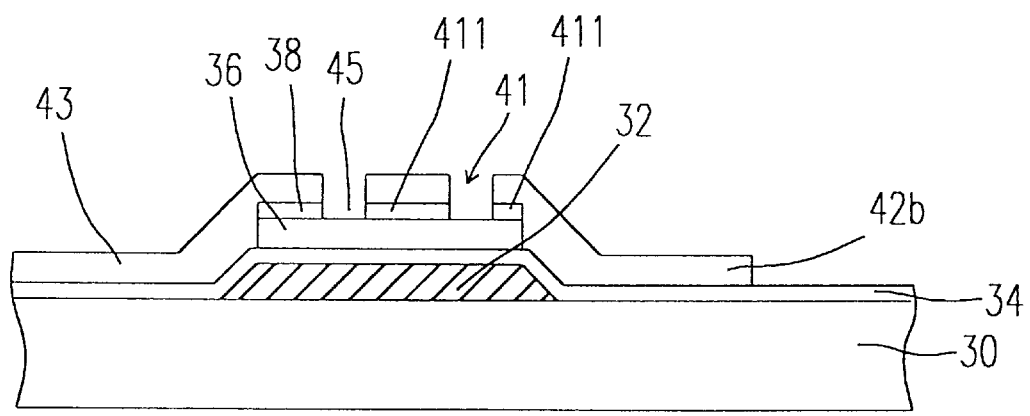
Figure 2G:
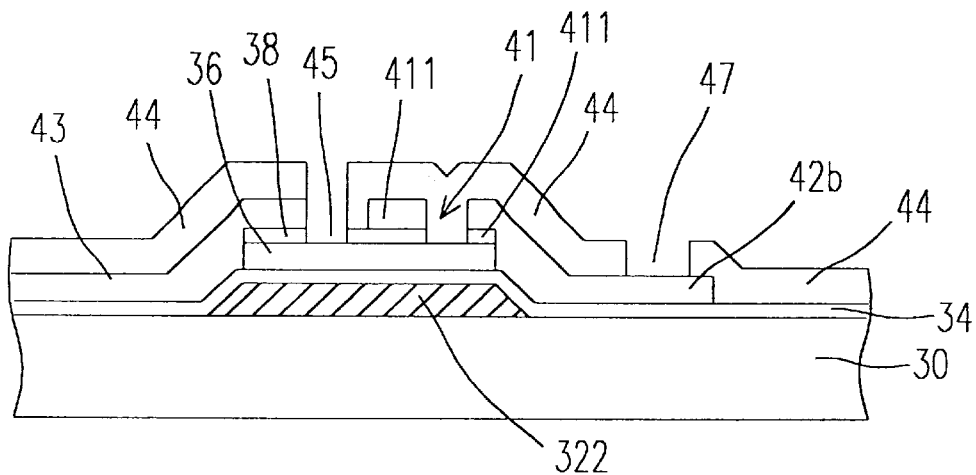
Figure 2H:
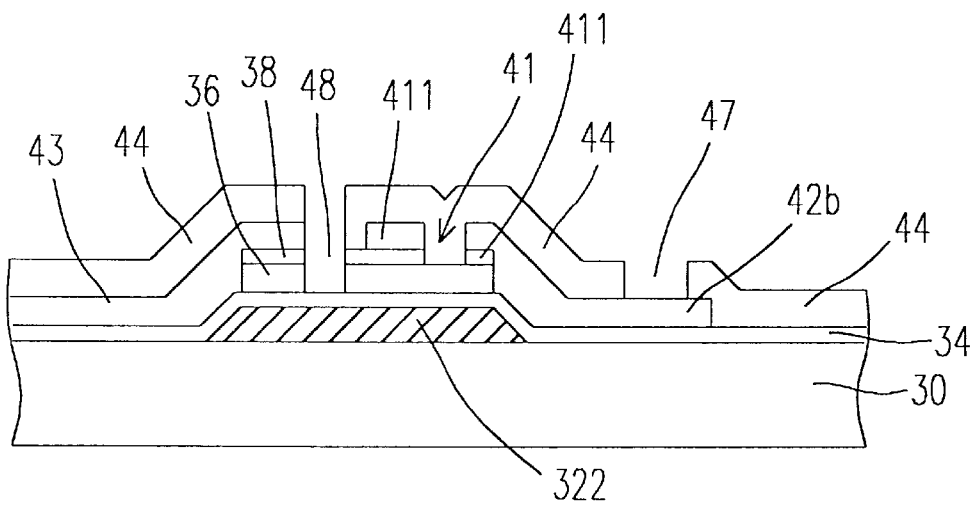
Figure 2I:
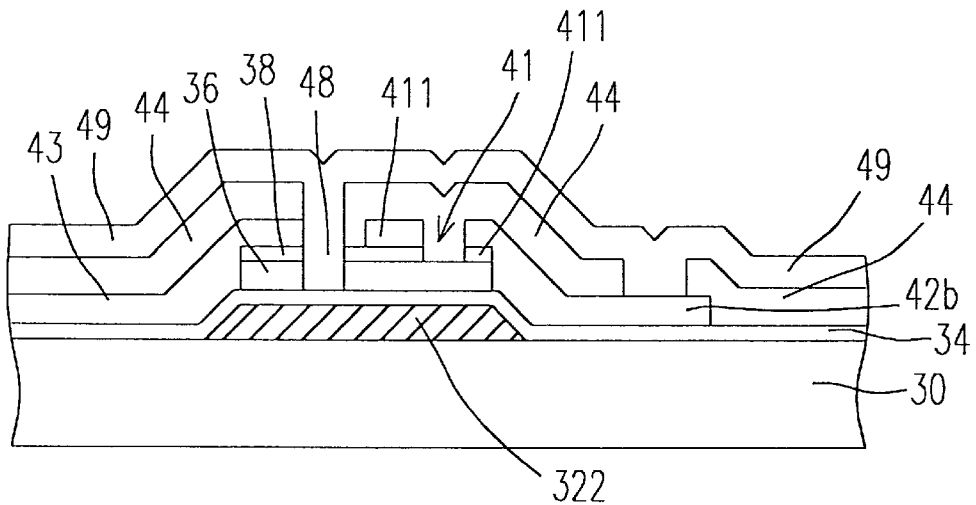
Figure 2J:
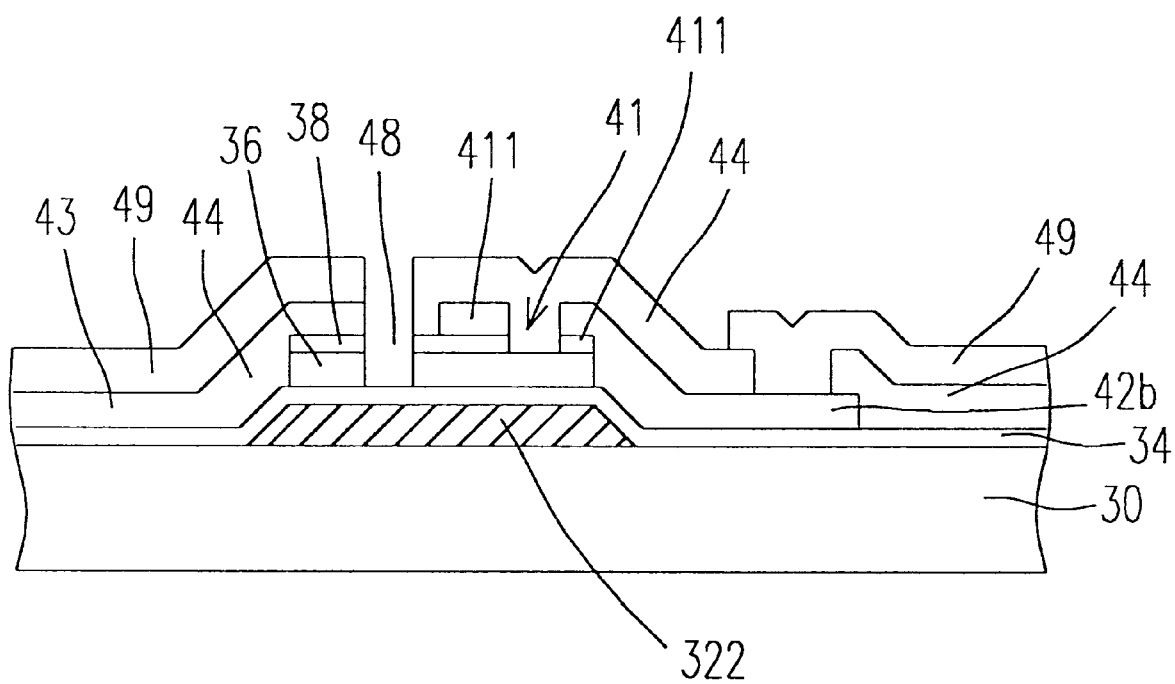
Figure 3A:
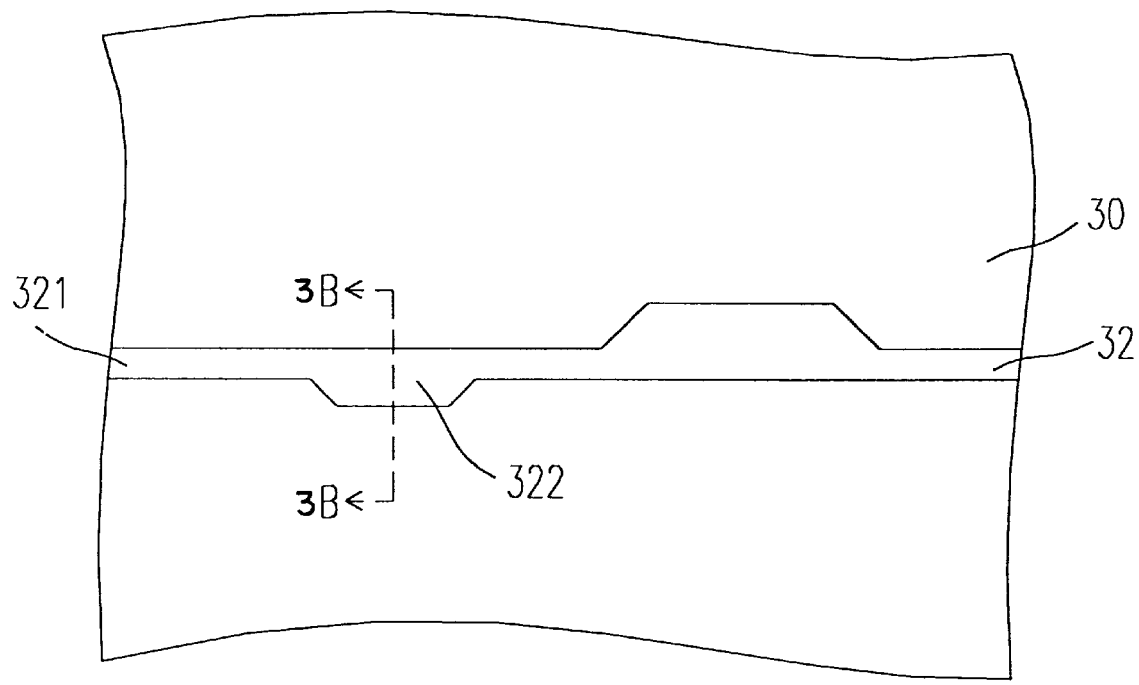
FIGS. 3A~3D are partial top plane views corresponding to the structures of FIG. 2.
Figure 3B:
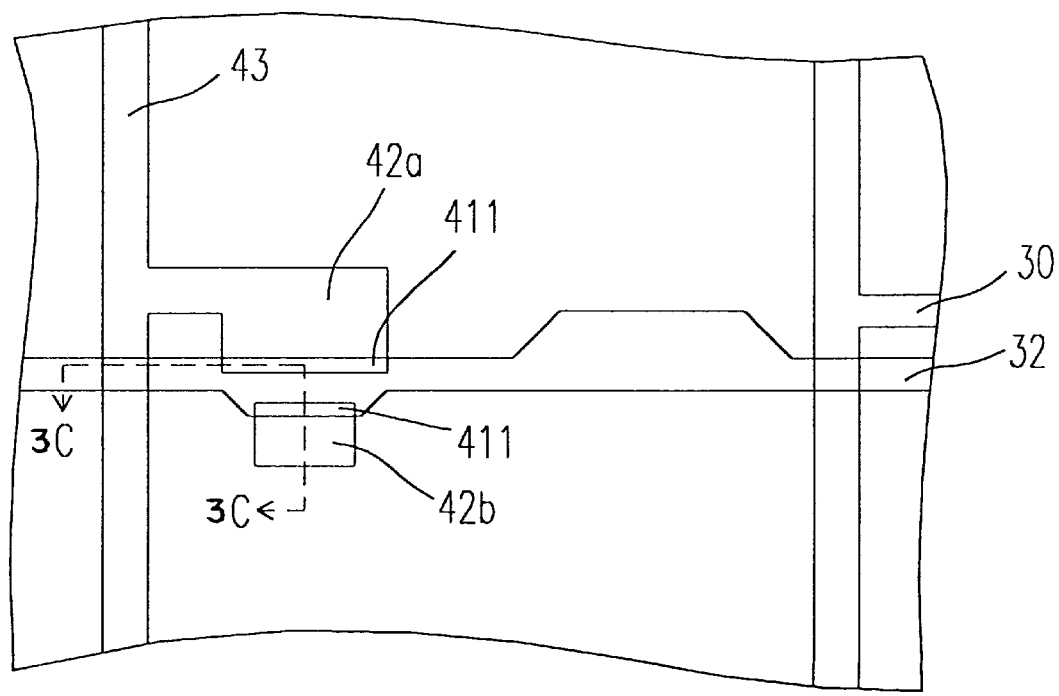
Figure 3C:
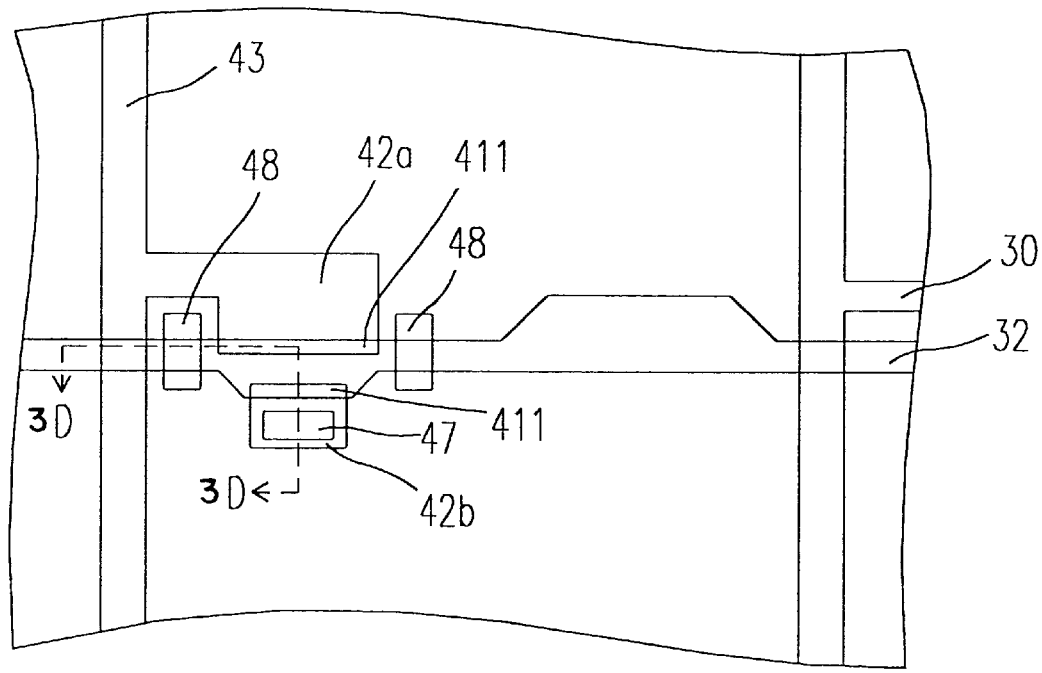
Figure 3D:
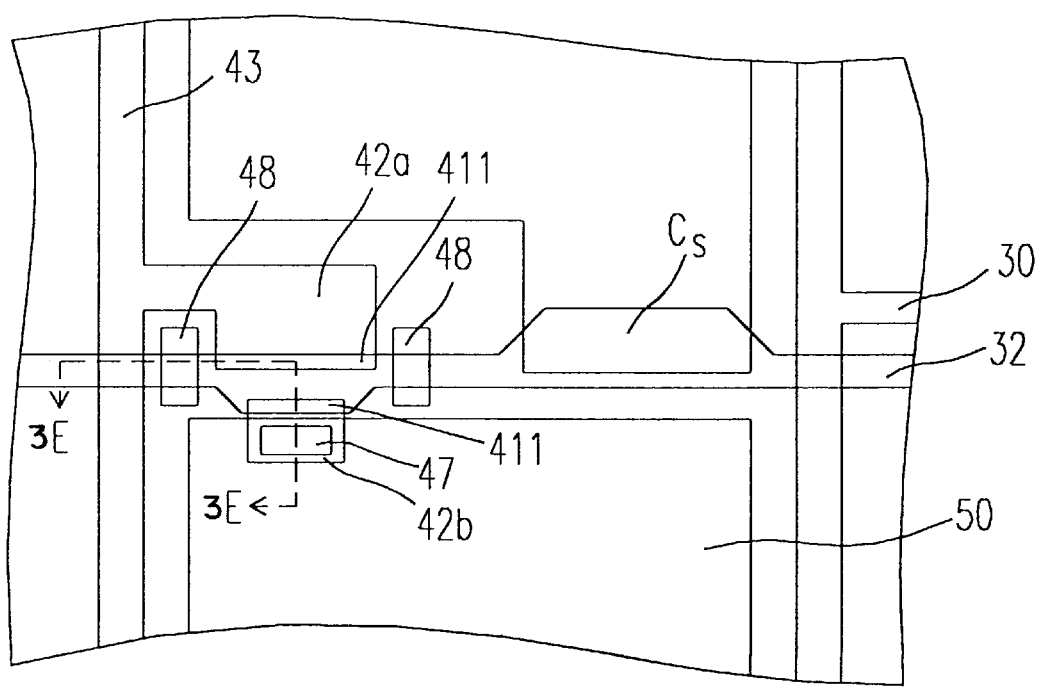
Figure 4:
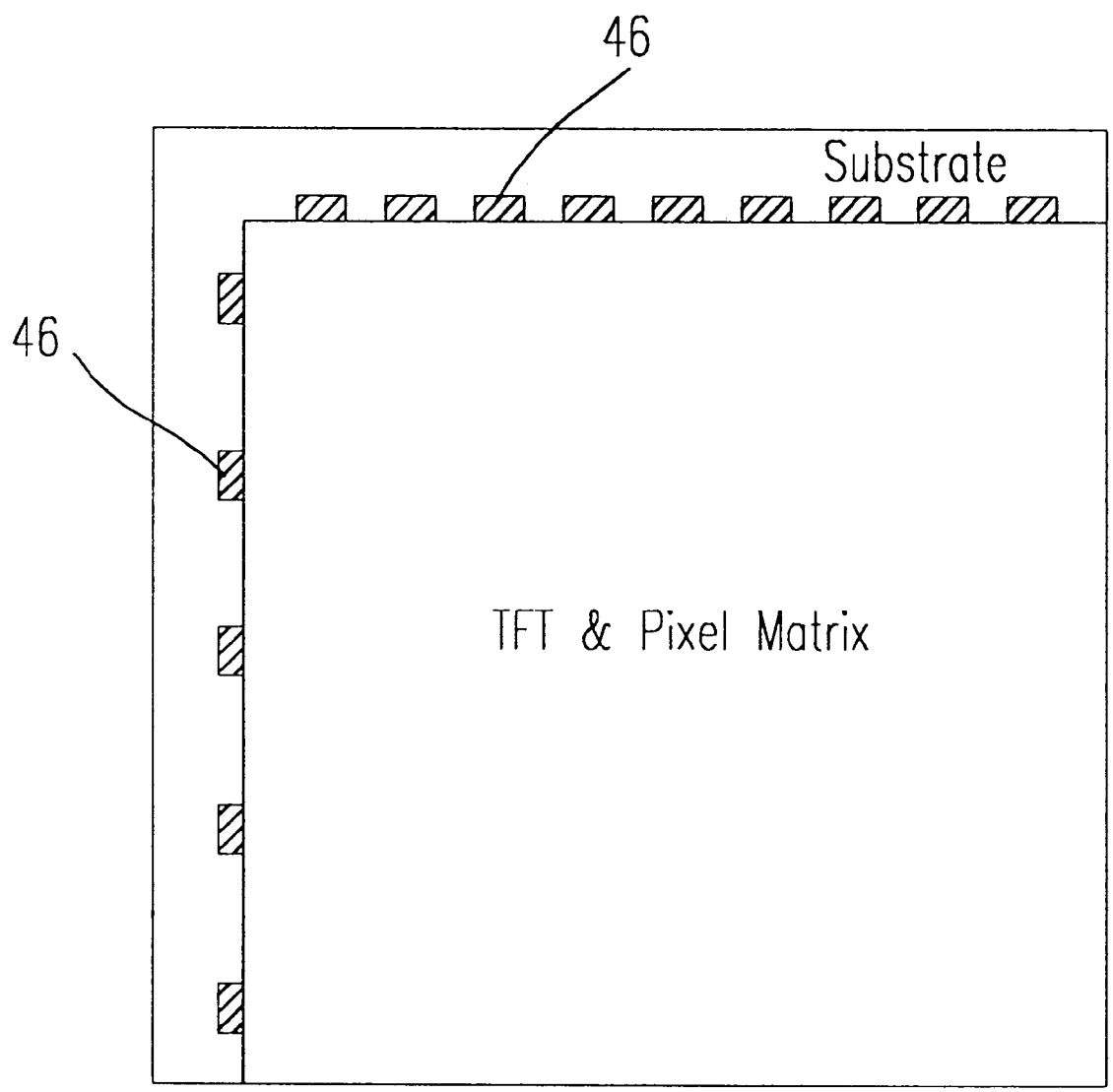
FIG. 4 is a partial top plane view of the TFT matrix of a TFTLCD, which schematically shows the TAB windows for the scan line and the data line.

A preferred embodiment of a process for forming a TFT matrix of a TFTLCD according to the present invention is illustrated with reference to FIGS. 2, 3 and 4. It is to be noted that the division of steps and the provision of serial numbers as below are for corresponding to the drawings, and for easy illustration and understanding, instead of critically indicating the separation or the integration of steps. The preferred embodiment of the process includes steps of:

i) applying a Cr layer 31 onto a front side 301 of a glass substrate 30 as a first conductive layer, as shown in FIG. 2A;

ii) using a first photo-masking and lithography procedure to pattern and etch the Cr layer 31 to form an active region 32 consisting of a scan line 321 and a gate electrode 322 of a TFT unit, as shown in FIGS. 2B and 3A wherein FIG. 2B is a cross-sectional view taken along the B—B line of FIG. 3A;

iii) consecutively and sequentially forming a silicon nitride layer 34 as an insulation layer, an amorphous silicon (a-Si) layer 36 as a semiconductor layer, an n$^+$ amorphous silicon layer 38 as a doped semiconductor layer, and a photoresist 40 on the resulting structure of FIG. 2B, as shown in FIG. 2C, and exposing the resulting structure from the back side 302 of the substrate 30, as indicated by arrows, wherein a portion of the photoresist 40 above the region 32 is shielded by the region 32 from exposure so as to exhibit a self-aligned effect;

iv) etching off the exposed photoresist 40, portions of the layers 36 and 38 thereunder, and the remaining photoresist so that each of the remaining layers 36 and 38 has a shape substantially identical to the region 32, as shown in FIG. 2D and with reference to FIG. 3A;

v) applying a Cr/Al composite layer 42 on the resulting structure of FIG. 2D as a second conductive layer, using a second photo-masking and lithography procedure to pattern and etch the Cr/Al layer 42 to integrally form a data line 43, a first connection line 42a between the TFT unit 41 and the data line 43, and a second connection line 42b connecting to the TFT unit 41, and using the remaining Cr/Al layer as a shield to etch off a portion of the doped a-Si layer 38 to separate the source/drain electrodes 411 of the TFT unit 41, and to define an isolation window area 45, as shown in FIGS. 2F and 3B wherein FIG. 2F is a cross-sectional view taken along the C—C line of FIG. 3B;

vi) applying a silicon nitride layer 44 on the resulting structure of FIG. 2F as a passivation layer, and using a third photo-masking and lithography procedure to pattern and etch the passivation layer 44 to expose the isolation window area 45, create TAB contact windows 46 for the scan line and the data line, and create a contact hole 47 to expose the second connection line 42b, as shown in FIGS. 2G and 4;

vii) using the remaining passivation layer 44 of FIG. 2G as a shield to etch off a portion of the a-Si layer 36 in the isolation window area 45 to form an isolation window 48 for cutting off the connection of the TFT unit 41 with the data line 43 through the a-Si layer 36, as shown in FIG. 2H and FIG. 3C wherein FIG. 2H is a cross-sectional view taken along the D—D line of FIG. 3C;

viii) applying an ITO layer 49 on the resulting structure of FIG. 2H as a transparent conductive layer, as shown in FIG. 2I; and ix) using a fourth photo-masking and lithography procedure to pattern and etch the ITO layer 49 to form a pixel electrode 50 by a single side of the TFT unit 41, as shown in FIGS. 2J and 3D wherein FIG. 2J is a cross-sectional view taken along the E—E line of FIG. 3D.

In the step i) of the above embodiment, the first conductive layer 32 can be applied by any suitable conventional technique which is not to be redundantly described here. In this embodiment, the substrate 30 is formed of glass which is transparent for allowing light type of exposing source to transmit therethrough. The substrate 30, however, can also be made of another transparent, translucent or opaque material, depending on the type of the exposing source. On the other hand, the first conductive layer 31 can also be formed of tungsten molybdenum, tantalum, aluminum or copper.

In the step ii) of the above embodiment, the photo-masking and lithography procedure can be performed by any suitable conventional technique which is not to be redundantly described here.

In the step iii) of the above embodiment, the insulation layer 34, semiconductor layer 36, doped semiconductor layer 38 and photoresist 40 can be applied by any suitable conventional technique which is not to be redundantly described here. The insulation layer 34 can also be formed of silicon oxide, silicon oxynitride, tantalum oxide or aluminum oxide. The semiconductor layer 36 can also be formed micro-crystalline silicon or polysilicon. The doped semiconductor layer 38 can also be formed of n$^+$ micro-crystalline silicon and n$^+$ polysilicon.

In the step iv) of the above embodiment, the etching procedure can be performed by any suitable conventional technique which is not to be redundantly described here.

In the step v) of the above embodiment, the second conductive layer 42 can be applied by any suitable conventional technique which is not to be redundantly described here. The second conductive layer 42 can also be a Mo/Al/Mo layer. On the other hand, the photo-masking and lithography procedure and the etching procedure can be performed by any suitable conventional techniques which are not to be redundantly described here.

In the step vi) of the above embodiment, the passivation layer 44 can be applied by any suitable conventional technique which is not to be redundantly described here. The passivation layer 44 can also be formed of silicon oxynitride. On the other hand, the photo-masking and lithography procedure can be performed by any suitable conventional technique which is not to be redundantly described here. It is to be noted, however, the etching of the passivation layer 44 in the TAB window 46 and contact hole 47 area stops in front of the second conductive layer 42, and that in the isolation window area 45 stops in front of the semiconductor layer 36. It is because that there exists a high etching selectivity between the silicon nitride passivation layer 44 and the a-Si semiconductor layer 36 with $CHF_3$, $CF_4$, $H_2$, $SF_6$ or a mixture thereof as an etching gas.

In the step vii) of the above embodiment, an selective etching procedure is performed by using $CF_4$, $BCl_3$, $Cl_2$, $SF_6$ or a mixture thereof as an etching gas to etch the a-Si semiconductor layer 36 in front of the silicon nitride insulation layer 34.

In the step viii) of the above embodiment, the transparent conductive layer 49 can be applied by any suitable conventional technique, and preferably by sputtering. The transparent conductive layer can also be formed of indium zinc oxide or indium lead oxide.

In the step ix) of the above embodiment, the photomasking and lithography procedure can be performed by any suitable conventional technique which is not to be redundantly described here. The label Cs in FIG. 3D indicates a storage capacitor formed between the gate electrode and the ITO electrode as Cs on gate or Cs on common.

According to the process mentioned above, the production of the pixel electrode is performed after the formation of the scan line, data line and TFT unit, and only four masking and patterning procedures are required. Owing to the provision of the isolation window 48, the masking and patterning procedure of the semiconductor and doped semiconductor layers 36 and 38 for isolating the TFT unit, similar to the step iii) of the conventional process mentioned above, can be omitted. The creation of the isolation window 48, on the other hand, is performed together with the creation of the TAB windows 46 without requiring any additional masking and patterning procedure. Furthermore, the creation of the TAB windows 46 for the scan line and the data line is performed in a single step so as to further reduce the masking count. Therefore, the process for forming the TFT matrix of a TFTLCD can be simplified according to the present invention so as to reduce cost and enhance yield.

It is understood that the masking count can be further reduced to three by omitting the passivation layer if reliability is not taken into consideration.

On the other hand, the isolation window 48 according to the present invention is preferably provided for cutting off the connection of the TFT unit 41 with the data line 43 through the semiconductor layer 36. The presence of the isolation window 48, however, is not an essential for the process because the insulating property of the semiconductor layer such as the a-Si layer is acceptable to some extent.

Furthermore, the connection line 42a between the TFT unit 41 and the data line 43 is integrally formed with the data line 43 so as to be of the same material as the data line 43, i.e. Cr/Al in the illustrative embodiment. Therefore, the connection line 42a has a relatively low resistivity compared to the ITO connection line so as to be suitable for a large-area TFTLCD.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for forming a thin film transistor (TFT) matrix for a liquid crystal display (LCD), comprising steps of:

providing a substrate made of an insulating material;

forming a first conductive layer on a first side of said substrate, and using a first masking and patterning procedure to form a scan line and a gate electrode of a TFT unit;

successively forming an insulation layer, a semiconductor layer, a doped semiconductor layer, and a photoresist layer on said substrate with said scan line and said gate electrode;

providing an exposing source from a second side of said substrate opposite to said first side by using said scan line and said gate electrode as shields to form an exposed area and an unexposed area;

removing said photoresist, said doped semiconductor layer, and said semiconductor layer of said exposed area so that the remaining portion of said semiconductor and said doped semiconductor layers in said unexposed area has a specific shape substantially identical to the shape of said scan line together with said gate electrode;

forming a second conductive layer on said substrate with said semiconductor and said doped semiconductor layer of said specific shape, and using a second masking and patterning procedure to integrally form a data line, a first connection line between said TFT unit and said data line, and a second connection line connecting to said TFT unit;

removing a portion of said doped semiconductor layer with said data line, and said first and said second connection lines as shields; and forming a transparent conductive layer on said substrate with said data line, and said first and said second connection lines, and using a third masking and patterning procedure to form a pixel electrode which is connected to said TFT unit through said second connection line.

2. The method according to claim 1 wherein said insulating material is a light-transmitting material, and said exposing source is a light radiation.

3. The method according to claim 2 wherein said light-transmitting material is glass.

4. The method according to claim 1 wherein said first conductive layer is formed of a material selected from a group consisting of chromium, tungsten molybdenum, tantalum, aluminum and copper.

5. The method according to claim 1 wherein said insulation layer is formed of a material selected from a group consisting of silicon nitride, silicon oxide, silicon oxynitride, tantalum oxide and aluminum oxide.

6. The method according to claim 1 wherein said semiconductor layer is formed of a material selected from a group consisting of amorphous silicon, micro-crystalline silicon and polysilicon.

7. The method according to claim 1 wherein said doped semiconductor layer is formed of a material selected from a group consisting of $n^+$ amorphous silicon, $n^+$ micro-crystalline silicon and $n^+$ polysilicon.

8. The method according to claim 1 wherein said second conductive layer is one selected from a group consisting of a chromium/aluminum and a molybdenum/aluminum/molybdenum composite layers.

9. The method according to claim 1 wherein said transparent conductive layer is formed of a material selected from a group consisting of indium tin oxide, indium zinc oxide and indium lead oxide.

10. The method according to claim 9 wherein said transparent conductive layer is formed by sputtering.

11. The method according to claim 1 wherein said patterned transparent conductive layer is located by a single side of said TFT unit.

12. The method according to claim 1 further comprising a step of forming a passivation layer on said substrate with said data line, and said first and said second connection lines after said step of removing said portion of said doped semiconductor layer with said data line, and said first and said second connection lines as shields, and using a fourth masking and patterning procedure to define an isolation window area, and create a contact hole.

13. The method according to claim 12 wherein said passivation layer is formed of a material selected from a group consisting of silicon nitride and silicon oxynitride.

14. The method according to claim 12 further comprising a step of removing a portion of said semiconductor layer in said isolation window area with said patterned passivation layer as a shield to form an isolation window for cutting off the connection of said TFT unit with said data line through said semiconductor layer.

15. The method according to claim 12 wherein said transparent conductive layer extends into said contact hole to connect to said second connection line.

16. A process for forming a thin film transistor (TFT) matrix for a liquid crystal display (LCD), comprising steps of:

providing a light-emitting substrate;

forming a first conductive layer on said substrate at a first side hereof;

using a first photo-mask to pattern said first conductive layer as a scan line and a gate electrode of a TFT unit;

sequentially forming an insulation layer, a semiconductor layer, and a doped semiconductor layer over said substrate with said scan line and said gate electrode;

using said scan line and said gate electrode as shields, and a radiation light from a second side of said substrate opposite to said first side as an exposing source to pattern said semiconductor and said doped semiconductor layers to define source/drain electrodes of said TFT unit;

forming a second conductive layer over said substrate with said patterned semiconductor and doped semiconductor layers;

using a second photo-mask to pattern said second conductive layer as a data line, a first connection line between said TFT unit and said data line, and a second connection line connecting to said TFT unit;

using said data line, and said first and said second connection lines as shields to remove a portion of said doped semiconductor layer to define an isolation window area;

forming a passivation layer over said substrate with said patterned second conductive layer;

using a third photo-mask to pattern said passivation layer to simultaneously uncover said isolation window area, create a contact hole for exposing a portion of said second connection line, and create a tape automated bonding (TAB) window for exposing a portion of said scan line and said data line; and using said patterned passivation layer as a shield to remove a portion of said semiconductor layer in said isolation window area to form an isolation window;

forming a transparent conductive layer on said substrate with said patterned passivation layer; and using a fourth photo-mask to pattern said transparent conductive layer as a pixel electrode which extends into said contact hole to connect with said TFT unit through said second connection line.

17. The method according to claim 16 wherein said insulating material is glass.

18. The method according to claim 16 wherein said first conductive layer is one selected from a group consisting of a chromium, a tungsten molybdenum, a tantalum, a aluminum and a copper layers, and said second conductive layer is one selected from a group consisting of a chromium/aluminum and a molybdenum/aluminum/molybdenum composite layers.

19. The method according to claim 16 wherein said insulation layer is formed of a material selected from a group consisting of silicon nitride, silicon oxide, silicon oxynitride, tantalum oxide and aluminum oxide.

20. The method according to claim 16 wherein said semiconductor layer is formed of a material selected from a group consisting of amorphous silicon, micro-crystalline silicon and polysilicon, and said doped semiconductor layer is formed of a material selected from a group consisting of highly doped amorphous silicon, micro-crystalline silicon and polysilicon.

21. The method according to claim 16 wherein said passivation layer is formed of a material selected from a group consisting of silicon nitride and silicon oxynitride.

22. The method according to claim 16 wherein said transparent conductive layer is formed of a material selected from a group consisting of indium tin oxide, indium zinc oxide and indium lead oxide.

23. A process for forming a thin film transistor (TFT) matrix for a liquid crystal display (LCD), comprising steps of:

providing a substrate made of an insulating material;

forming a first conductive layer of a first pattern on a first side of said substrate as a scan line and a gate electrode of a TFT unit;

forming an insulation layer over said scan line and said gate electrode;

forming a semiconductor and a doped semiconductor layers of a second pattern substantially identical to said first pattern on said insulation layer for defining a source and a drain electrodes of said TFT unit;

forming a second conductive layer of a third pattern over said semiconductor and said doped semiconductor layers of said second pattern as a data line, a first connection line between said TFT unit and said data line, and a second connection line connecting to said TFT unit;

removing a portion of said semiconductor and said doped semiconductor layers to create an isolation window for cutting off the connection of said TFT unit with said data line through said semiconductor and said doped semiconductor layers;

removing another portion of said doped semiconductor layer to isolate said source electrode from said drain electrode of said TFT unit;

forming a passivation layer of a fourth pattern over said second conductive layer which includes a contact hole to expose a portion of said second connection line; and forming a transparent conductive layer of a fifth pattern over said passivation layer as a pixel electrode, which further extends into said contact hole to connect with said second connection line.

* * * * *